(12) United States Patent
Bury

(10) Patent No.: US 11,329,678 B2
(45) Date of Patent: May 10, 2022

(54) INTERFACE BETWEEN RADIO RECEIVER AND BASEBAND RECEIVER AND A METHOD FOR CONVERTING RF-SIGNALS TO BB-SIGNALS

(71) Applicant: COMMSOLID GMBH, Dresden (DE)

(72) Inventor: Andreas Bury, Dresden (DE)

(73) Assignee: COMMSOLID GMBH, Dresden (DE)

( * ) Notice: Subject to any disclaimer, the term of this patent is extended or adjusted under 35 U.S.C. 154(b) by 357 days.

(21) Appl. No.: 16/476,666

(22) PCT Filed: Aug. 21, 2018

(86) PCT No.: PCT/EP2018/072525
§ 371 (c)(1),
(2) Date: Jul. 9, 2019

(87) PCT Pub. No.: WO2020/038565
PCT Pub. Date: Feb. 27, 2020

(65) Prior Publication Data
US 2021/0336643 A1    Oct. 28, 2021

(51) Int. Cl.
*H03M 3/00* (2006.01)
*H04B 1/10* (2006.01)

(52) U.S. Cl.
CPC ............ *H04B 1/1027* (2013.01); *H03M 3/40* (2013.01); *H03M 3/456* (2013.01); *H03M 3/458* (2013.01); *H03M 3/422* (2013.01)

(58) Field of Classification Search
CPC ...... H04B 1/1027; H03M 3/40; H03M 3/458; H03M 3/456; H03M 3/422
(Continued)

(56) References Cited

U.S. PATENT DOCUMENTS 6,356,594 B1 *  3/2002  Clement ................. H03C 3/403
                                             375/261
7,116,965 B2 * 10/2006  Minnis .................... H03D 3/007
                                             455/323
(Continued)

FOREIGN PATENT DOCUMENTS

EP          3367574 A1     8/2018
KR    20070012311 A   *  1/2007  ............. H04L 7/041
(Continued)

OTHER PUBLICATIONS

International Search Report and Written Opinion issued in PCT/EP2018/072525 dated May 28, 2019.
(Continued)

*Primary Examiner* — Jean B Jeanglaude
(74) *Attorney, Agent, or Firm* — Heslin Rothenberg Farley and Mesiti PC; Nicholas Mesiti

(57) ABSTRACT

A receiver system includes an interface between a radio receiver on a radio frequency (RF)-side and a baseband receiver on a baseband (BB)-side. The receiver includes an antenna for receiving radio frequency signals and an analogue-to-digital converter for converting received analogue signals to digital signals. The digital signals are further processed in the baseband receiver by a digital signal processing unit. The analogue-to-digital converter is a sigma-delta converter, which includes a sigma-delta modulator on the RF-side and a decimation filter on the BB-side.
(Continued)

The sigma-delta modulator and the decimation filter are connected only by single-bit in-phase (I) and quadrature (Q) streams output lines.

17 Claims, 4 Drawing Sheets

(58) Field of Classification Search
USPC .......................................... 341/143; 375/340
See application file for complete search history.

(56) References Cited

U.S. PATENT DOCUMENTS

| | | | | |
|---|---|---|---|---|
| 7,663,522 | B2* | 2/2010 | Koli | H03M 3/344 |
| | | | | 341/143 |
| 8,249,535 | B2* | 8/2012 | Ridgers | H03D 3/007 |
| | | | | 455/230 |
| 2003/0067404 | A1 | 4/2003 | Ruha et al. | |
| 2004/0071238 | A1* | 4/2004 | Khlat | H03M 3/494 |
| | | | | 375/346 |
| 2005/0068886 | A1 | 3/2005 | Wang et al. | |
| 2008/0278360 | A1* | 11/2008 | Koli | H03H 17/0251 |
| | | | | 341/143 |
| 2009/0252206 | A1* | 10/2009 | Rheinfelder | H04B 1/40 |
| | | | | 375/219 |
| 2010/0291891 | A1* | 11/2010 | Ridgers | H04B 1/30 |
| | | | | 455/205 |

FOREIGN PATENT DOCUMENTS

| | | |
|---|---|---|
| WO | 93/07679 A1 | 4/1993 |
| WO | 2006126166 A1 | 11/2006 |

OTHER PUBLICATIONS

Bonnie Baker, "How delta-sigma ADCs work, Part 1"—Texas Instruments Incorporated, Analog Applications Journal, Jul. 1, 2011, Retrieved from Internet: http://www.ti.com/lit/an/slyt423a/slyt423a.pdf, the whole document.

Bonnie Baker, "How delta-sigma ADCs work, Part 2"—Texas Instruments Incorporated, Analog Applications Journal, Oct. 1, 2011, Retrieved from Internet: http://www.ti.com/lit/an/slyt438/slyt438.pdf, the whole document.

* cited by examiner

INTERFACE BETWEEN RADIO RECEIVER AND BASEBAND RECEIVER AND A METHOD FOR CONVERTING RF-SIGNALS TO BB-SIGNALS

CROSS REFERENCE TO RELATED APPLICATIONS

This application is the National Phase filing under 35 U.S.C. § 371 of International Application No.: PCT/EP2018/072525, filed on Aug. 21, 2018. The contents of the prior application is hereby incorporated by reference herein in its entirety.

The invention relates to an interface between a radio receiver on a RF-side and a baseband receiver on a BB-side whereas the radio receiver comprises means for receiving radio frequency signals and an analog-to-digital converter for converting received analogue signals to digital signals whereas the digital signals are further processed in the baseband receiver by a digital signal processing unit.

BACKGROUND ART

The invention also relates to a method for converting a radio-frequency signal received by a radio receiver on a radio-frequency side to a baseband signal in a baseband receiver on a baseband side.

Figure 1:
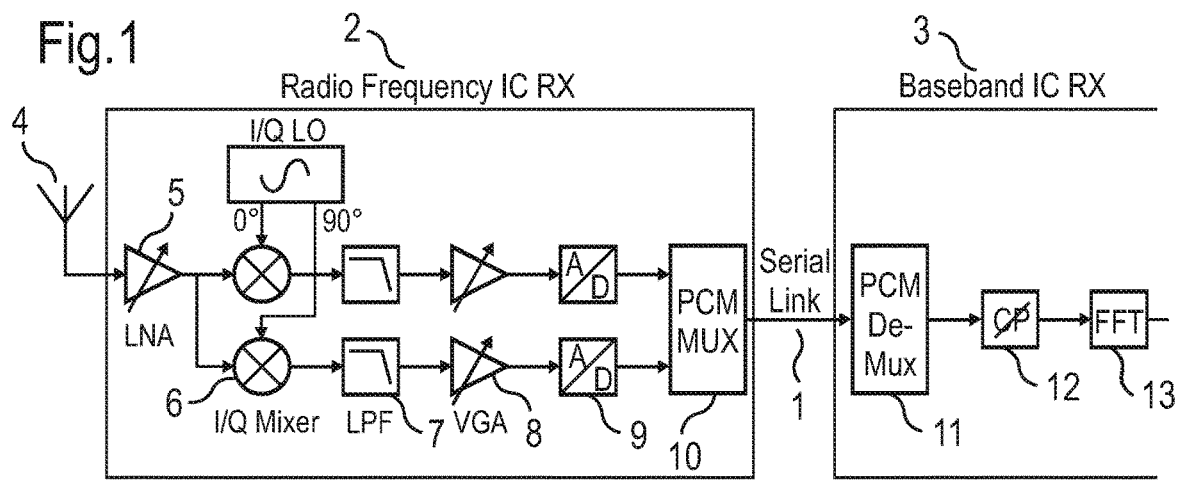

In radio receivers, the interface between the RF-(radio-frequency) side and the baseband-(BB) side is at the analogue-to-digital (ADC) output. This interface provides a serial link 1 between the radio frequency IC 2 (integrated circuit) and the baseband IC 3 (FIG. 1). The RF-side 2, also called RF front-end comprises one or more antenna 4 for receiving and transmitting RF-signals, power amplifiers 5, 8, filters 7, duplexers, and converters 9 for converting the transmitting or the receiving signal from digital-to-analog or from analog-to-digital. It also includes frequency translation stages, filtering stages and sampling interfaces. Usually, as stated, the front-end includes both analog and digital signal processing stages, whereas a serial link 1 connects the RF-side 2 with the BB-side 3. In receiving direction the RF front-end comprises an analog-to-digital converter (ADC) whereas through the serial link each sample comes as a multi-bit word corresponding to the particular ADC resolution. Words which are packed into the serial stream must be equipped with means for synchronization, in order to determine word boundaries and proper order of in-phase (I) and quadrature phase (Q) samples. Both on the RF- and BB-side special hardware for packing ("PCM Mux") and unpacking ("PCM De-Mux") the serial data is required.

There are a large number of methods that can be used for converting analog to digital signals, for example with a comparator method (counting method), a single-slope converter (sawtooth/One-ramp-method), a dual and/or quad slope converter (More-ramp method), parallel converter, and so on. The inner of a conversion is controlled by the internal blocks of the ADU themselves and every method has its own advantages and drawbacks.

As an ADC, a sigma-delta AD-converter can be used. An advantage of the delta-sigma converter is that the dynamic of the converter can be mutually exchanged by the bandwidth within certain limits. By continuously scanning at the entrance, no sample and hold circuit is required. In addition, low demands on the analog anti-aliasing filter are made. Incremental Sigma-Delta analog-to-digital converters process typically an analog input signal to assign a digital output signal that is preferably proportional to this analog input or to realize a preferably unique mapping of the analog input signal to a digital output word.

This sigma-delta AD-converter includes a digital decimation filter which is designed to deliver a certain maximum signal-to-noise ratio (SNR) over a certain given receive bandwidth. The maximum SNR defines the dynamic range of an A/D converter. The dynamic range is limited by clipping at the upper end and quantization noise at the lower end. The quantization noise power is the integral over the quantization noise spectral density, within the delivered bandwidth. By narrowing the bandwidth the lower is the quantization noise power, and thus, increase the dynamic range. In the case of sigma-delta A/D converters: Because of the inherent so-called "noise shaping" of the sigma-delta modulator, the noise spectral density gets large at high frequencies and very low at low frequencies. A digital filter limits the bandwidth in the area of low noise spectral density, delivering low noise at the filter output, and thus, a large signal-to-noise ratio, even for a one-bit quantization within the sigma-delta modulator is possible.

Figure 2:
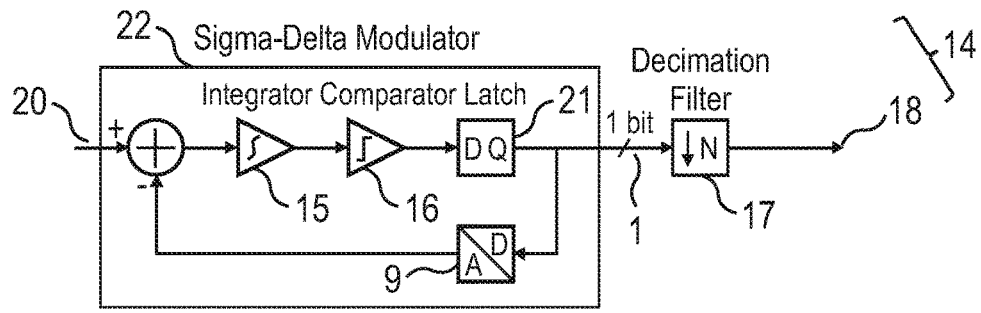

FIG. 2 details the components of a sigma-delta ADC 14, which is in this basic example a 1st order single-bit continuous-time baseband sampling sigma-delta ADC 14 comprising a sigma-delta modulator 22 and a decimation filter 17. An input signal 20 that has to be converted, is first modulated by a modulator loop for a certain, predetermined clock cycle number N before the digital bit-stream 1 at the output of the internal quantizer 21 is digitally filtered 17. After N clock cycles the digital filters 17 outputs a digital representation 18 of the analog input of the input signal 20.

Figure 3:
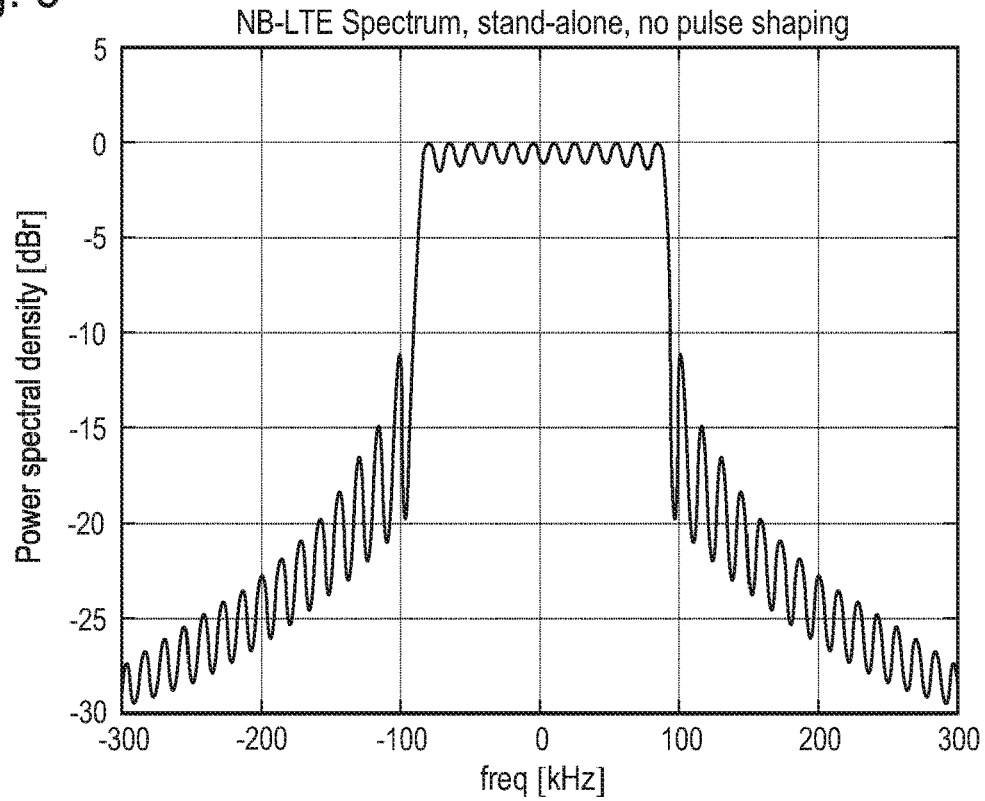

The LTE standard uses Single-Carrier Frequency Division Multiple Access (SC-FDMA) in the uplink and Orthogonal Frequency Division Multiple Access (OFDMA) in the downlink. Furthermore, a frame structure is used to allocate and assign resources to different users. A frame spans a time period of 10 ms and consists of 10 subframes of 1 ms duration each, whereas one subframe comprises 12 or 14 OFDM symbols depending on if an extended cyclic prefix is used or the normal cyclic prefix is used, respectively. The smallest addressable unit is a so called resource block that spans 180 kHz in frequency that corresponds to 12 subcarriers of 15 kHz and spans 1 ms in time. Multiple users can share the bandwidth by having assigned different resource blocks at different time. In 3GPP Release 8 and 9, those blocks are always assigned contiguous but in further releases, also non-contiguous assignment may be possible to increase diversity. This is also called narrowband LTE signal comprises 12 OFDM-subcarriers (also called symbols). FIG. 3 shows the transmit spectrum of a narrowband LTE signal without special means for out-of-band power reduction (no pulse shaping).

In the LTE standard a so-called cyclic prefix (CP) is used and inserted into the OFDM symbol in order to obtain a time window of orthogonal data transmission without inter-carrier and inter-symbol interference. Thus, a cyclic prefix is a guard band that is made between the LTE symbols. This guard band is required in order to cope with inter-symbol interference. It is possible to get rid of the inter-symbol interference by extending the duration of the symbol. But it is quite complicated to get rid from the inter-symbol interference unless the cyclic prefix is inserted. So the cyclic prefix actually have two element. The one is a guard band which its duration is in the magnitude of the delay spread. And another action made with the cyclic prefix is actually the duplication of the cyclic prefix from the beginning of the symbol to the end of the symbol. This is made in order to assist the receiver, the correlators in the receiver to cope with the inter-symbol interference. So LTE defines two length of cyclic prefix. The short one which is called normal CP is 4.7 µs and this is most suitable for urban environment where the reflections that create the multi-path propagation come from relatively short distances in the magnitude of 1-2 km. But the LTE defines another length of CP and this is CP of 16.67 µs and this can be used in rural areas where the reflections that create the multi-path propagation arrives form relatively long distances like 5 km or so.

Figure 4:
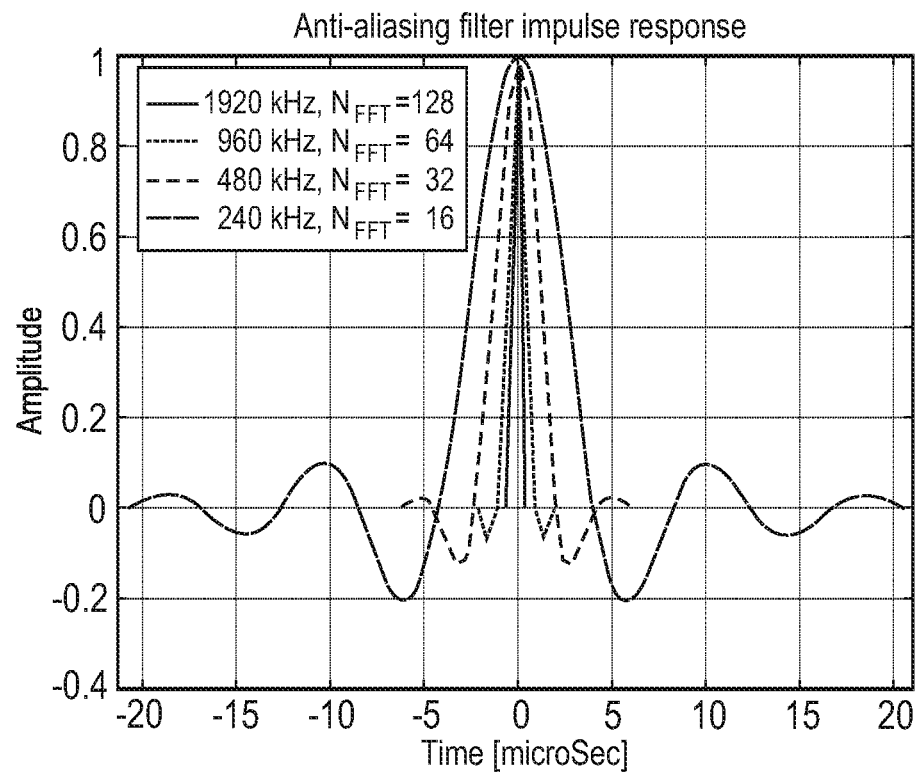

In the receiver chain, the analog mixer output signal must be converted to a digital sample stream and eventually, for OFDM reception, into frequency-domain subcarriers within the transmission bandwidth. To achieve lowest power consumption, it is desirable for the receiver to operate at the lowest possible sample rate to satisfy the sampling theorem. However, lower sampling rates yield longer impulse responses of the anti-aliasing filter, as shown in FIG. 4. A larger sampling frequency results in a larger FFT-length, but in any case only 12 FFT carriers are needed, so only a partial FFT needs to be computed.

Figure 5:
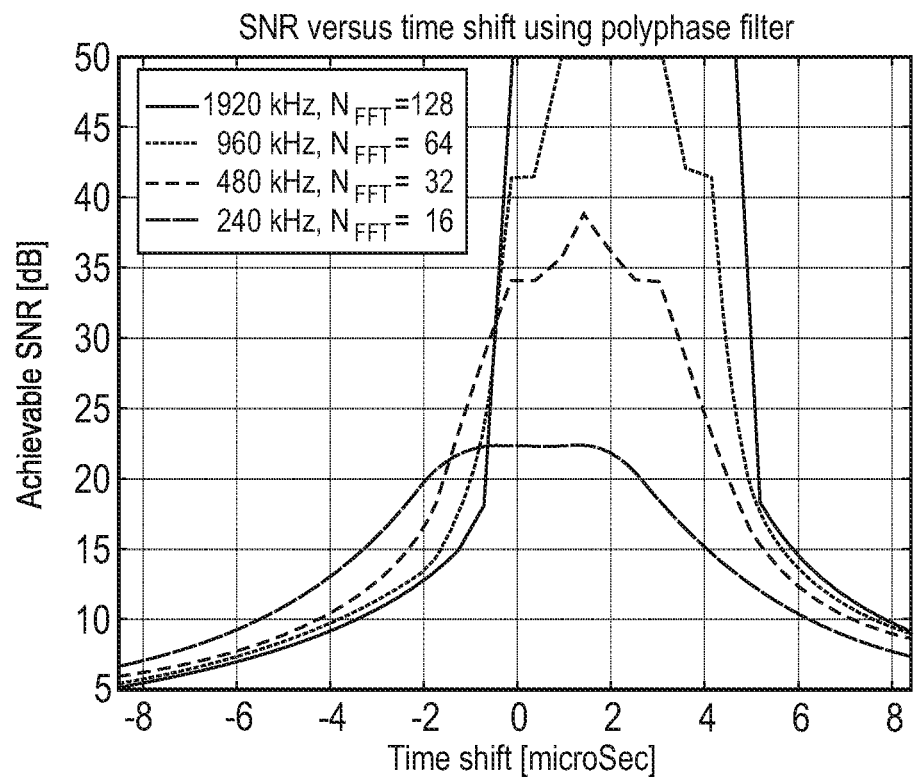

As a consequence of the anti-aliasing filter impulse response length, sampling at the smallest rate to capture the receiver bandwidth yields significant inter-symbol interference, assuming that the filter impulse response for the narrowest sampling rate is significantly longer than the cyclic prefix length, thus degrading receiver performance at higher signal-to-noise ratio. FIG. 5 illustrates this for the signal format defined for narrowband LTE. The x-axis represents the time shift in ms, whereas the y-axis represents the "Achievable SNR" which denotes a limitation of the achievable signal-to-noise ratio due to added random distortion from inter-symbol interference.

Figure 6:
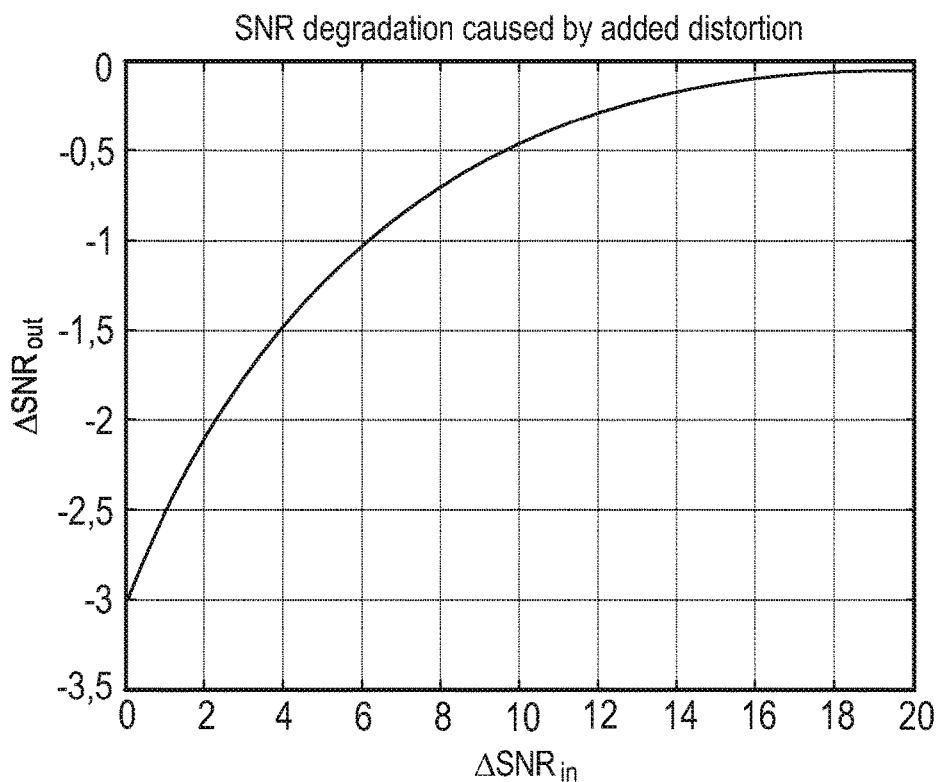

In general, the receiver SNR shall not be limited by distortion caused by inter-symbol interference (ISI). So, the following curve in FIG. 6 shows the receiver effective SNR degradation due to this "achievable SNR" limitation. The plot in FIG. 6 illustrates the relationship between $\Delta SNR_{in}$ represents the "achievable SNR limited by ISI distortion" minus the "receiver input SNR"; and $\Delta SNR_{out}$ represents the "effective SNR seen by the receiver" minus the "receiver input SNR".

For example, if the achievable SNR is 22 dB (top of dashed/red curve in FIG. 5), the receiver input SNR must be $\Delta SNR_{in}$=17 dB lower to achieve an SNR degradation of $\Delta SNR_{out}$=−0.1 dB, which means that for receiver input SNR of 5 dB or lower, the SNR degradation caused by inter-symbol interference is negligible in practice.

It is therefore the objective of the present invention to find an effective way to overcome the limitation of the receiver's SNR by distortion caused by inter-symbol interference (ISI) resulting from the anti-aliasing filter impulse response and therefor to overcome the minimization of the sensitivity of the receiver.

It is also an objective of the invention to give full control of the decimation filter design to baseband developers and the receiver chain design like the analog blocks to RF developers.

SUMMARY OF THE INVENTION

This objective is achieved by an interface between a radio receiver on a RF-side and a baseband receiver on a BB-side of the type mentioned above, in which the analogue-to-digital converter is a sigma-delta converter comprising a sigma-delta modulator on the RF-side and a decimation filter on the BB-side. The splitting between the RF/BB interface gives full control of the decimation filter design to baseband developers, while RF developers need to take care only of analog blocks in the receiver chain.

In a preferred embodiment the decimation filter is characterized by a sampling rate and a FFT and the decimation filter is operable for selecting its sampling rate and its FFT-length according to a signal-to-noise ratio of the radio receiver. Therefore, the sigma-delta ADC is split to keep only the sigma-delta modulator on the RF side while moving the decimation filter to the baseband side. Single-bit I and Q streams pass the sigma-delta-modulator output signals from the RF to the baseband IC, at a fixed rate. The decimation filters are selectable for various output sampling frequencies. Thereby, the FFT-length is the Fast-Fourier-Transformation length used for converting an analogue signal into the digital domain. So, the baseband side uses the FFT as part of the decimation and can select: At a low SNR of the receiver on the RF-side, the decimation is done at a smallest sampling frequency and do basically all decimation before FFT; and at a high SNR of the receiver on the RF-side, the decimation is done at a higher sampling frequency and do part of the decimation inside FFT.

Furthermore, the sigma-delta modulator comprises single-bit I and Q streams output lines connected to the baseband receiver in order to represent a received signal much more precise than just using a series of samples of the momentary amplitude of the signal. The advantage of using 1-bit I/Q streams is that the 1-bit I/Q streams require only a synchronous clock on RF and BB side which is given in any case, but no packing and unpacking hardware is need, thus avoiding related power consumption.

In another embodiment of the invention the sigma-delta modulator is a multi-bit analog sigma-delta modulator.

In a preferred embodiment of the invention the decimation filter is operable for selecting various output sampling frequencies. This means that a dynamic sampling rate switching is provided. For this configuration no additional control of the RF hardware is necessary and therefore the RF design can be kept very simple.

In another embodiment of the present invention the baseband receiver includes a signal-to-noise estimator. The signal-to-noise estimator estimates the signal-to-noise ratio of the receiver. Typically an SNR estimator consists of separately estimating the signal power and noise power, and computing the ratio. In LTE, transmitted reference symbols (sometimes called pilot tones), which are known at the receiver, are typically employed to estimate both the signal and noise power. If the estimated SNR falls below a certain threshold, a first sampling rate is selected, using a first decimation factor along with for example a first cyclic prefix removal unit and a first FFT size. If the estimated SNR exceeds the threshold, a second sampling rate that is larger than the first sampling rate is selected, using a second decimation factor along with for example a second cyclic prefix removal unit and a second FFT size.

For that, in one embodiment the signal-to-noise estimator is connected to switches for selectable switching between different decimation filters (at least between a first and a second decimation filter) and an output switch for outputting the digital signal.

It is possible that the baseband receiver comprises a cyclic prefix removal unit. The cyclic prefix has to be removed in order to rebuild the correct signal content, meaning to discard some samples, i.e., to ignore them when picking the useful samples. The cyclic prefix is only an auxiliary means for obtaining a time window of orthogonal data transmission without inter-carrier and inter-symbol interference. Thus, a cyclic prefix is a guard band that is made between the LTE symbols. This guard band is required in order to cope with inter-symbol interference.

The objective of the invention is also achieved by a method for converting a radio-frequency signal received by a radio receiver on a radio-frequency side to a baseband signal in a baseband receiver on a baseband side of the type mentioned above, in which a signal-to-noise ratio of the radio receiver is estimated and according to the signal-to-noise ratio a decimation filter on the baseband side is selected. If the estimated SNR falls below a certain threshold, a first sampling rate is selected, using a first decimation factor along with a first cyclic prefix removal unit and a first FFT size. If the estimated SNR exceeds the threshold, a second sampling rate that is larger than the first sampling rate is selected, using a second decimation factor along with a second cyclic prefix removal unit and a second FFT size.

In one embodiment of the invention a sampling rate and a FFT-length of the decimation filter is selected. The selection will be based on the estimated SNR of the receiver. With the adapted sampling rate and FFT-length the SNR of the receiver is not limited by distortion caused by inter-symbol interference (ISI) resulting from the anti-aliasing filter impulse response and the sensitivity of the receiver will not be minimized, because of a fixed sampling rate or FFT-length.

In a preferred embodiment of the invention at a low signal-to-noise ratio the sampling rate is decimated to a smallest sampling frequency of the decimation filter and do decimation before the FFT. This has the advantage of lowest complexity for FFT processing and smallest memory demand for stored signal samples, which are beneficial for lowest power consumption.

In the case of a high signal-to-noise ratio the sampling rate is decimated to a higher sampling frequency of the decimation filter and do part of a decimation inside the FFT. This has the advantage of reduced inter-symbol interference and thus reduced SNR reduction when receiving through a multipath channel with a certain delay span.

BRIEF DESCRIPTION OF THE DRAWING FIGURES

The invention will be explained in more detail using an exemplary embodiment.

The appended drawings show

Figure 7:
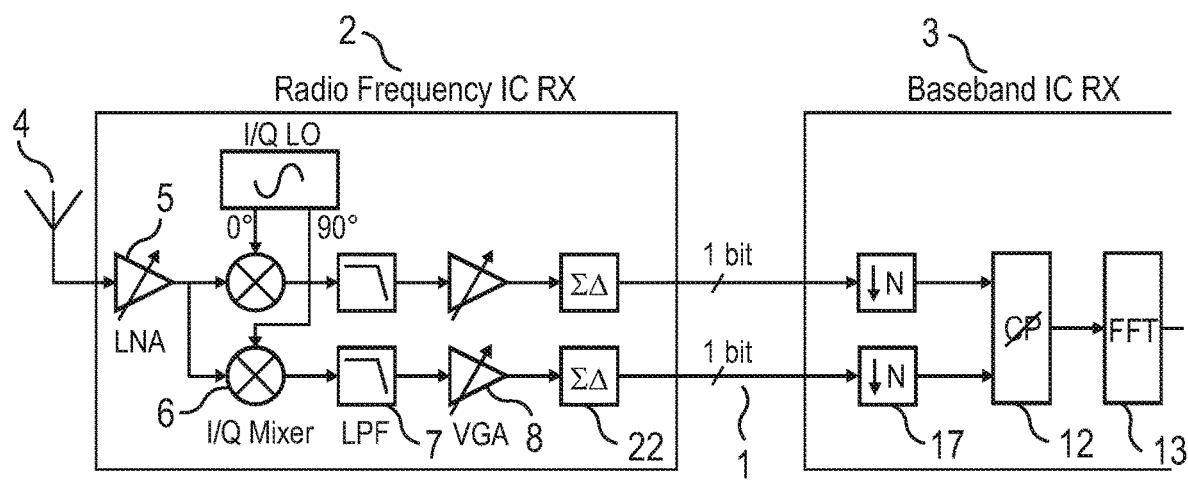
Figure 8:
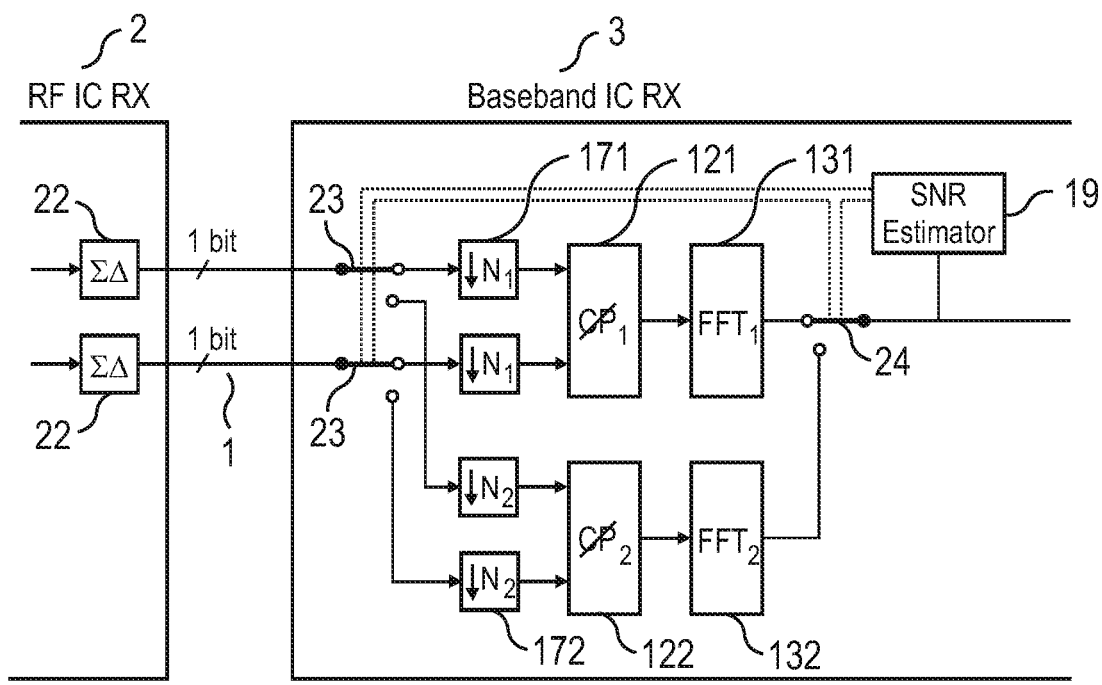

FIG. 1 A radio receiver, an interface boundary between RF and baseband is at the analog-to-digital converter (ADC) output according to the state-of-the-art;

FIG. 2 A sigma-delta modulator as a 1st order single-bit continuous-time baseband sampling sigma-delta ADC, according to the state-of-the-art;

FIG. 3 A transmit spectrum of a narrowband LTE signal without special means for out-of-band power reduction (no pulse shaping);

FIG. 4 An anti-aliasing filter impulse response for different sampling rates;

FIG. 5 Signal-to-noise ratio of a receiver according to the sampling rate;

FIG. 6 Signal-to-noise ratio degradation of a receiver caused by added distortion;

FIG. 7 Architectural mapping of the inventive interface between radio receiver and baseband receiver;

FIG. 8 Detailed view of the inventive baseband receiver.

DETAILED DESCRIPTION

FIG. 7 shows the architectural mapping of the inventive interface between radio receiver 2 and baseband receiver 3.

The sampling rate and the associated FFT length are selected depending on the receiver signal-to-noise ratio, in order to minimize sensitivity degradation caused by inter-symbol interference resulting from the anti-aliasing filter impulse response. At any sampling rate and FFT length the FFT will be part of the decimation filtering 17, thus relaxing requirements and simplifying the dedicated decimation filter 17 before the FFT 13. That cannot be achieved with state-of-the-art decimation filtering included in a sigma-delta ADC. Typical time domain FIR or IIR decimation filters have limited filter selectivity, with a wide transition band between passband and stopband. In contrast, FFT-based filtering is very sharp, with the filter bandwidth being the number of used FFT bins times the bin bandwidth. Therefore, the sigma-delta ADC 14 is split to keep only the sigma-delta modulator 22 on the RF side while moving the decimation filter 17 to the baseband side. Single-bit I and Q streams 1 pass the sigma-delta-modulator 22 output signals from the RF to the baseband IC, at a fixed rate. The decimation filters 171, 172 are selectable for various output sampling frequencies. Thus, the baseband side uses the FFT 13 as part of the decimation and can select: At low SNR, decimate to smallest sampling frequency and do basically all decimation before FFT 13; at high SNR, decimate to a higher sampling frequency and do part of the decimation inside FFT 13. FIG. 7 shows the signal flow. The FIR or IIR decimation filters 17 have a fairly wide transition band, and the FFT 13 performs sharp FFT bin filtering.

FIG. 8 shows the invention in more detail. The baseband receiver 3 includes a signal-to-noise estimator 19. The signal-to-noise estimator 19 estimates the signal-to-noise ratio of the receiver 2. If the estimated SNR falls below a certain threshold, a first sampling rate is selected, using a first decimation factor along with a first cyclic prefix removal unit 121 and a first FFT size 131. If the estimated SNR exceeds the threshold, a second sampling rate that is larger than the first sampling rate is selected, using a second decimation factor along with a second cyclic prefix removal unit 122 and a second FFT size 132.

REFERENCE SIGNS 1 bit stream
2 radio receiver on RF-side
3 baseband receiver on BB-side
4 antenna
5 low-noise amplifier
6 mixer
7 low pass filter
8 voltage gain amplifier
9 analog-to-digital converter
10 PCM multiplexer
11 PCM demultiplexer
12 removing cyclic prefix
13 fast-fourier transformation means
14 sigma delta analog to digital converter
15 integrator
16 comparator
17 digital filter
18 digital signal
19 signal-to-noise estimator
20 input signal
21 internal quantizier
22 sigma-delta modulator
23 switch
24 output switch
121 first removing cyclic prefix means 122 second removing cyclic prefix means
131 first fast-fourier transformation means
132 second fast-fourier transformation means
171 first digital filter
172 second digital filter

The invention claimed is:

1. A receiver system comprising an interface between a radio receiver on a radio frequency (RF)-side and a baseband receiver on a baseband (BB)-side, wherein the receiver comprises means for receiving radio frequency signals and an analogue-to-digital converter for converting received analogue signals to digital signals, wherein the digital signals are further processed in the baseband receiver by a digital signal processing unit, and wherein the analogue-to-digital converter is a sigma-delta converter comprising a sigma-delta modulator on the RF-side and a decimation filter on the BB-side, wherein the sigma-delta modulator and the decimation filter are connected only by single-bit in-phase (I) and quadrature (Q) streams output lines, where no additional control of the RF side is necessary and a splitting between the RF/BB interface gives full control of a decimation filter design.

2. The receiver system comprising an interface between a radio receiver on the RF-side and a baseband receiver on a BB-side according to claim 1, wherein the decimation filter has a sampling rate and a FFT-length and the decimation filter is operable for selecting its sampling rate and its FFT-length according to a signal-to-noise ratio of the radio receiver.

3. The receiver system comprising an interface between a radio receiver on the RF-side and a baseband receiver on a BB-side according to claim 1, wherein the sigma-delta modulator is a multi-bit analog sigma-delta modulator.

4. The receiver system comprising an interface between a radio receiver on the RF-side and a baseband receiver on a BB-side according to claim 1, wherein the sigma-delta modulator comprises single-bit I and Q streams output lines connected to the baseband receiver.

5. The receiver system comprising an interface between a radio receiver on the RF-side and a baseband receiver on a BB-side according to claim 1, wherein the decimation filter is operable for selecting various output sampling frequencies.

6. The receiver system comprising an interface between a radio receiver on the RF-side and a baseband receiver on a BB-side according to claim 1, wherein the baseband receiver includes a signal-to-noise estimator.

7. The receiver system comprising an interface between a radio receiver on the RF-side and a baseband receiver on a BB-side according to claim 6, wherein the signal-to-noise estimator is connected to switches for selectable switching between different decimation filters and an output switch for outputting the digital signal.

8. A method for converting an analog radio-frequency signal received by a radio receiver on a radio-frequency side to a digital baseband signal in a baseband receiver on a baseband side using a sigma-delta modulator on the radio frequency (RF) side and a decimation filter on the baseband (BB) side, wherein the sigma-delta modulator and the decimation filter are connected only by single-bit in-phase (I) and quadrature (Q) streams output lines, wherein a signal-to-noise ratio of the radio receiver is estimated and according to the signal-to-noise ratio a decimation filter on the baseband side is selected.

9. The method for converting a radio-frequency signal received by a radio receiver on a radio-frequency side to a baseband signal in a baseband receiver on a baseband side according to claim 8, wherein a sampling rate and a FFT-length of the decimation filter is selected.

10. The method for converting a radio-frequency signal received by a radio receiver on a radio-frequency side to a baseband signal in a baseband receiver on a baseband side according to claim 8, wherein at a low signal-to-noise ratio the sampling rate is decimate to a smallest sampling frequency of the decimation filter and do decimation before the FFT.

11. The method for converting a radio-frequency signal received by a radio receiver on a radio-frequency side to a baseband signal in a baseband receiver on a baseband side according to claim 8, wherein at a high signal-to-noise ratio the sampling rate is decimate to a higher sampling frequency of the decimation filter and do part of a decimation inside the FFT.

12. The receiver system comprising an interface between a radio receiver on the RF-side and a baseband receiver on a BB-side according to claim 2, wherein the sigma-delta modulator is a multi-bit analog sigma-delta modulator.

13. The receiver system comprising an interface between a radio receiver on the RF-side and a baseband receiver on a BB-side according to claim 12, wherein the sigma-delta modulator comprises single-bit I and Q streams output lines connected to the baseband receiver.

14. The receiver system comprising an interface between a radio receiver on the RF-side and a baseband receiver on a BB-side according to claim 13, wherein the decimation filter is operable for selecting various output sampling frequencies.

15. The receiver system comprising an interface between a radio receiver on the RF-side and a baseband receiver on a BB-side according to claim 14, wherein the baseband receiver includes a signal-to-noise estimator.

16. The method for converting a radio-frequency signal received by a radio receiver on a radio-frequency side to a baseband signal in a baseband receiver on a baseband side according to claim 9, wherein at a low signal-to-noise ratio the sampling rate is decimate to a smallest sampling frequency of the decimation filter and do decimation before the FFT.

17. The method for converting a radio-frequency signal received by a radio receiver on a radio-frequency side to a baseband signal in a baseband receiver on a baseband side according to claim 16, wherein at a high signal-to-noise ratio the sampling rate is decimate to a higher sampling frequency of the decimation filter and do part of a decimation inside the FFT.

* * * * *